United States Patent
Farmer et al.

[11] Patent Number: 5,843,832
[45] Date of Patent: Dec. 1, 1998

[54] METHOD OF FORMATION OF THIN BONDED ULTRA-THIN WAFERS

[75] Inventors: Kenneth R. Farmer, Newark, N.J.; Thomas G. Digges, Jr.; N. Perry Cook, both of Fredericksburg, Va.

[73] Assignee: Virginia Semiconductor, Inc., Fredericksburg, Va.

[21] Appl. No.: 396,237

[22] Filed: Mar. 1, 1995

[51] Int. Cl.⁶ .................................................. H01L 21/76
[52] U.S. Cl. .......................... 438/406; 438/457; 438/973
[58] Field of Search ................................ 437/86, 62, 966, 437/914; 148/DIG. 12, DIG. 135; 438/406, 457, 459, 973, 455

[56] References Cited

U.S. PATENT DOCUMENTS

| | | |
|---|---|---|
| 4,752,180 | 6/1988 | Yoshikawa . |
| 4,854,986 | 8/1989 | Raby . |
| 4,883,215 | 11/1989 | Guesele et al. . |
| 5,131,968 | 7/1992 | Wells et al. . |
| 5,196,775 | 3/1993 | Hoshi . |
| 5,407,856 | 4/1995 | Quenzer et al. . |
| 5,478,782 | 12/1995 | Satoh et al. . |
| 5,514,235 | 5/1996 | Mitani et al. . |

FOREIGN PATENT DOCUMENTS

| | | |
|---|---|---|
| 0410679 | 1/1991 | European Pat. Off. . |
| 60-236210 | 11/1985 | Japan . |
| 1-4013 | 1/1989 | Japan . |
| 1-169917 | 7/1989 | Japan . |
| 256918 | 2/1990 | Japan . |
| 2126625 | 5/1990 | Japan . |
| 5275300 | 10/1993 | Japan . |

*Primary Examiner*—George R. Fourson
*Attorney, Agent, or Firm*—Fish & Richardson P.C.

[57] ABSTRACT

A technique of bonding a thin wafer layer to a substrate. The wafer is blown dry using an inert gas to prevent it from being damaged, while still ensuring that it dries completely. The initial bonding is done by orienting crystallographic axes, and then allowing the wafers to adhere to one another slowly. The contact wave is prevented from spreading, by a divider between the two wafers. The wafers are allowed to adhere to one another slowly to form a bond. The bond is strengthened by annealing.

19 Claims, 4 Drawing Sheets

METHOD OF FORMATION OF THIN BONDED ULTRA-THIN WAFERS

FIELD OF THE INVENTION

The present invention describes a bonding system for ultra-thin wafers and a bonded wafer product that has two joined materials, one of which is thinner than 200 μm. More specifically, the present invention defines a technique which can be used to form a bonded product including at least one ultra-thin wafer, having improved characteristics for optical, electrical and mechanical applications.

BACKGROUND AND SUMMARY OF THE INVENTION

As the demand for high performance and diverse applications increases, semiconductor devices must be made with thinner layers that have more abrupt transitions between the layers. Typical semiconductor devices are formed by material deposition of various kinds, including, for example, epitaxy. Changing the content of the layers during such deposition, however, leads to a relatively gradual change in device characteristics. Other semiconductor based devices require thin semiconductor films for use as membranes in microelectromechanical device systems or for use as a silicon on insulator (SOI) layer.

The substrate is generally either a virgin silicon wafer for SOS devices, a silicon wafer processed by growth or deposition of a secondary material for SOI devices, or an altered silicon wafer which has been etched or drilled for MEMS devices. The substrate may also be a non-silicon material such as glass.

It is known to grow a thin crystalline silicon film on a substrate using an epitaxial growth process at elevated temperatures under a high vacuum. However, this is a slow and expensive technique. The thin film must be grown one atomic layer at a time in a costly reaction chamber. Vapor phase epitaxy, for example, has a typical growth rate of 1 μm per minute at 1200° C. Molecular beam epitaxy is even slower.

Moreover, epitaxy has the additional drawback that very complex recrystallization techniques are used. This means that the epitaxy can only be performed using crystalline silicon substrates. This eliminates the possibility of using some important materials, such as amorphous oxide.

As described above, the films which are formed in this way are relatively thick e.g. several μm. These materials also have uneven and relatively gradually-changing doping concentrations.

Many ideal SOS device applications are based on geometries which provide an abrupt transition from one uniform doping concentration to another. The high temperatures and long times that are required for the thin film growth by epitaxy lead to dopant diffusion and junction broadening. Careful and complicated control of the doping techniques during growth have therefore been required.

In order to obtain a steep concentration gradient, the dopant concentration must be rapidly changed. However, even the most abrupt changes still undergo their transition over more than 20 μm of sample depth. This is far from being abrupt. Moreover, the dopant concentration of the epitaxial layer is never constant in the final product.

It is known to bond two semiconductor materials in order to obtain an abrupt transition between the two materials. However, no one in the art has ever been able to bond using sufficiently thin film single crystal silicon. By sufficiently thin, we mean 200 μm or less.

The conventional technique of forming silicon wafers usually starts with a single crystal ingot; and polishes slices of this ingot to an ultimate thickness ranging from 300–600 μm. A thinner ultra-thin silicon wafer, having a thickness less than 200 μm is also available from Virginia Semiconductor, Inc. Fredericksburg, Va. The inventors of the present invention, however, noted special problems exist, however, when attempting to attach these ultra-thin wafers to a substrate.

Typically, these wafers have been bonded to a substrate using direct or fusion bonding. The fusion bonding typically uses a heat process to fuse the silicon wafers to one another or to an oxide layer therebetween. The prior art technique brings the thin wafer into contact with a substrate, and then the two are annealed together at an elevated temperature to promote adhesion.

Anodic bonding requires the thin wafer be brought in contact with the substrate, and then adhesion is promoted by applying an electrical bias thereto. Annealing usually follows this adhesion step or is part of the adhesion step.

For example, lightly doped p-type thin silicon films bonded to heavily doped n-type silicon substrate have been used in optical and electrical applications—such as in a sensitive photodetector. N-type silicon films can be bonded to an oxidized n-type silicon substrate to form a silicon on insulator ("SOI") power device. A thin silicon film can be bonded to a micro-machined substrate to form a micromechanical or micro-electro mechanical system such as a pressure sensor or a miniature valve. Many other uses for bonded ultra-thin technologies are also well known in the art. No one, however, has been able to overcome the problems encountered when bonding a very thin wafer, e.g. less than 200 μm to a substrate. Such thin materials are fragile, difficult to handle, and easily deformed.

Such bonded thin materials would enjoy an important application in SOI. SOI applications are rapidly becoming an important technique to achieve superior designs for high power, high voltage devices. Silicon wafers bonded to oxidized silicon substrates provide improved isolation over conventional bulk silicon techniques. The maximum isolation in an SOI device is a function of both oxide and SOI thickness, with typical designs requiring SOI thicknesses in the range from less than 1 to around 30 μm. One current approach to forming such thin SOI layers is to "bond and polish back." In this approach, a silicon wafer of conventional thickness is bonded to an oxidized silicon wafer, then the top wafer is polished to the desired thickness. This process is difficult to control for SOI thicknesses less than around 10 μm, especially if a uniformly thin top layer with parallel surfaces is desired. Advances in technology, however, using complex, mask-specific, polish-stop techniques may lead to the manufacture of 0.1 μm thick films with ±0.01 μm surface roughness. Such uniformity will be possible only over limited portions of a wafer because of the lithographic processes which must be employed.

Perhaps the most serious drawback to the bond-and-polish technique is that bonded interfaces are never (except for the case of impractically high temperature and long time annealing) as strong as the bulk materials being bonded. This means that polishing after bonding may be an important yield detractor.

A second approach to forming thin SOI layers is the "bond and etch back" technique. In this technique, an etch-stop layer is formed in a conventional silicon wafer often by ion implanting or otherwise inserting a dopant. Then unwanted silicon is removed using an etch which "selects" silicon over the etch-stop layer. Though many novel bond-and-etch techniques have been introduced in recent years, none yields the desired combination of good thickness uniformity, low SOI roughness, low process complexity, undamaged silicon and low cost.

The inventors have recognized that an alternative to the above approach would be simply to bond an ultra-thin silicon wafer to the oxidized wafer, immediately forming the SOI stack, and eliminating or at least minimizing the risky polishing step after bonding.

For MMS and MEMS applications, thin mechanical membranes are often formed through the use of planar technology where the membrane material is deposited over another material which is then dissolved from under portions of the membrane, freeing it to move. This technique generally precludes the use of crystalline silicon as the membrane material unless complex and unreliable recrystallization methods are employed. Bonded wafer technology has been used for MEMS applications through the "bond and polish back" or the "bond and etch back" techniques described above. In the bond-and-etch technique for MEMS, an etch-stop layer is formed in a conventional silicon wafer as described above, to a depth equal to the desired membrane thickness. After burying this layer by bonding to a micromachined substrate, the unwanted silicon is removed by selective etching, leaving behind membranes over the micromachined features. The bond-and-polish technique for MEMS applications offers the same disadvantages as for SOI since it detracts from device yield. This disadvantage is more serious in the MEMS application, where polishing over micromachined structures is a more delicate process than polishing merely over bonded silicon. The bond-and-etch technique for MEMS also has disadvantages in that the required doping step adds additional process complexity, and lack of control over doping profile and uniformity leads to variations in membrane uniformity both across wafers, and from wafer to wafer. Furthermore, since the etch-stop layer must be heavily doped, electrical applications using the silicon membrane material are limited.

All of these disadvantages noted above could be eliminated using bonded ultra-thin silicon to micromachined substrates, if a practical technique of doing such were available. The membrane thickness is uniform and controllable, no heavily doped etch stop is required, the etching step is eliminated, and any silicon doping concentration may be used, opening a wide array of electrical, optical and mechanical applications using the silicon membrane material.

BRIEF DESCRIPTION OF THE DRAWINGS

These and other advantages will be described herein with reference to the accompanying drawings, in which.

DESCRIPTION OF THE PREFERRED EMBODIMENTS

The inventors of the present invention have developed improved techniques which allow an ultra-thin layer to be bonded to a substrate. This allows both the substrate and the thin layer to have precisely controllable and characteristics.

The preferred procedure for fabricating bonded wafer products generally follows the known procedure for bonding silicon-to-silicon described in, for example, S. Bengtsson and O. Engstrom, *J. Electrochem. Soc.* 137, 2297 (1990). This technique will not properly work with very thin materials, however. Therefore, the present invention defines making alterations in handling, aligning and annealing to accommodate the use of ultra-thin silicon.

Although we describe herein an embodiment showing an SOS application, similar techniques could be used for other embodiments including SOS devices with other doping combinations, MEMS structures, SOI structures, and other optical, electrical and mechanical devices.

The process starts with raw materials which are silicon wafers supplied by Virginia Semiconductor Inc: a) substrate wafer: double side polished, <100>±0.25° oriented, arsenic doped (n-type), 2.990–3.010 inch diameter, 0.00295–0.0037 ohm-cm, 368–395 micro-meters thick; b) top ultra-thin wafer: double side polished, <100>±0.25° oriented, boron doped (p-type), 2.990–3.010 inch diameter, resistivity $\geq$1000 ohm-cm, 35.6–40.6 $\mu$m thick. The total thickness variation across each wafer is less than 0.6 $\mu$m.

Figure 1A:
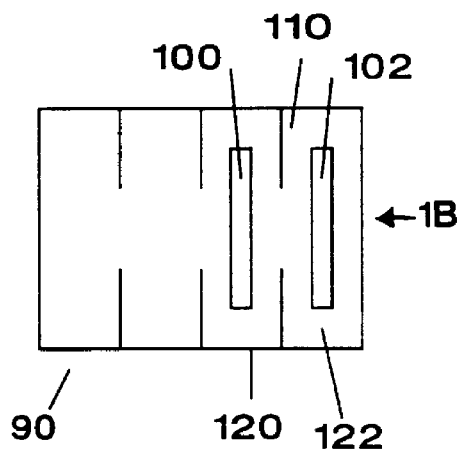
FIG. 1A shows a cassette holding wafer as used according to the present invention.
Figure 1B:
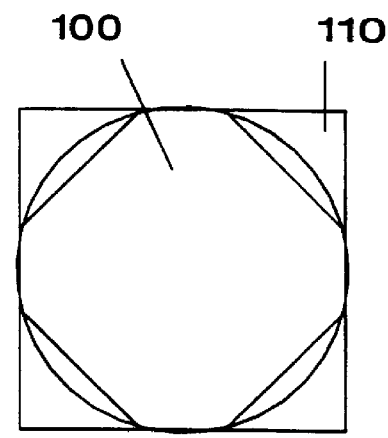
FIG. 1B shows an end-on view of the cassette, showing disc 100 and dividers 100.

The materials are held within a teflon cassette 90 which holds at least two wafers. Two wafers in a cassette are shown in FIGS. 1A and 1B. The cassette is shown in its side view in FIG. 1A, and shows both the wafers 100 and 102 in place. FIG. 1B shows the end-on view, looking from the direction of the arrow 1B in FIG. 1A, but with disc 102 removed so that the dividers 110 can be seen. Conceptually, the cassette looks like an open ended slide holder. All sides are open, but dividers 110 separate the wafers. Center portions of wafers 100, 102 are not divided so that only the outside edges of the wafers are separated from one another.

Figure 2A:
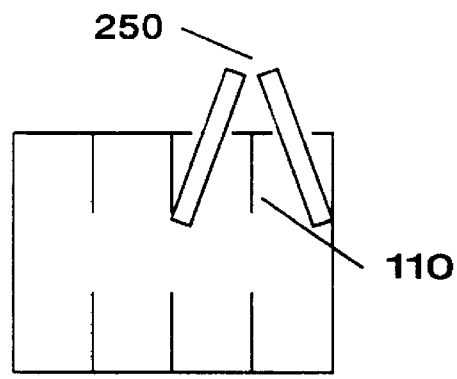
FIG. 2A shows the two wafers being removed form the cassette.
Figure 2:
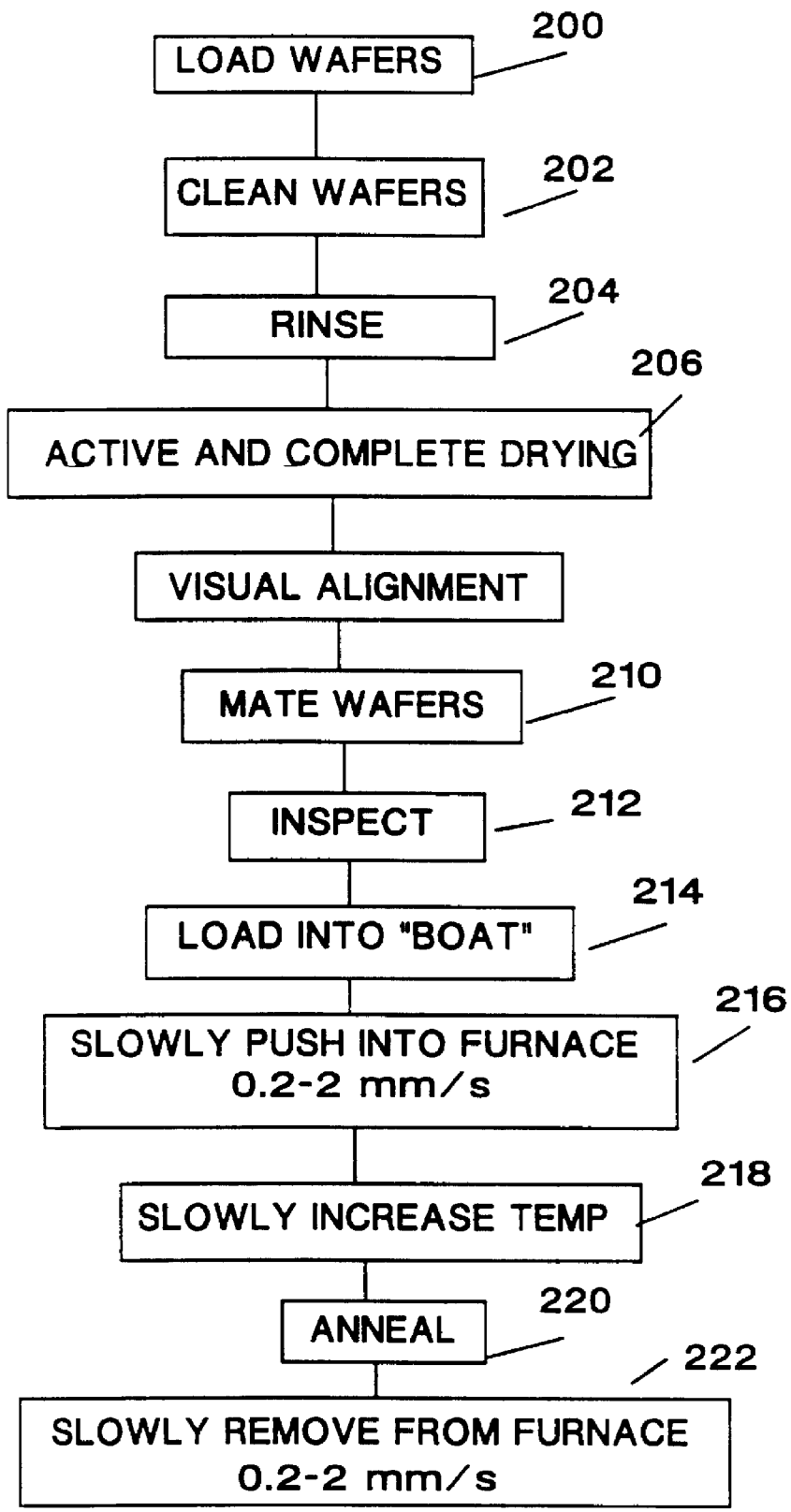
FIG. 2 is a flow diagram of the manufacturing process according to the present invention.

The preferred fabrication sequence of the present invention is described herein with reference to the flow diagram of FIG. 2.

At step 200, the wafers 100 and 102 are loaded, vertically, into adjacent slots 120, 122 of teflon cassette 90. The wafers are then chemically cleaned at step 202. This step preferably uses "P-Clean" in which the cassette is washed in an aqueous, electronic grade solution of 80%-$H_2SO_4$ mixed nominally 50:1 with 30% $H_2O_2$, for 10 minutes at 110° C.

At step 204, the cassette is rinsed: first in warm de-ionized water for 10 minutes at, 60°–70° C., then in cool de-ionized water, for 5 minutes, at around 20° C.

Step 206 is a drying step. In the prior art, while preventing contact between the wafers and the substrate wafers, the wafers were spun-dry in a commercial spinner. The inventors of the present invention recognized, however, that this was unsuitable for thin wafers. The drying step according to the present invention requires non-violent, yet active drying without agitating the wafers. The preferred drying technique according to the present invention is to carefully blow dry the wafers and cassette in a gentle stream of nitrogen gas. This is a non-standard step. We found that the ultra-thin wafer could not survive the rough handling which was used in the prior art. Moreover, we found that complete drying of the wafers is critical for achieving successful bonding. Without active drying, water tends to trap at the bonded interface. This trapped water tended to shatter the thin wafer during annealing at high temperatures.

An alternative drying technique is to allow the wafers to drip dry, followed by dipping the wafers into an isopropyl alcohol bath. The wafers are removed from the bath, and the alcohol is allowed to dry either passively or by active means. This slight amount of movement which is necessary to move the discs into and out of the alcohol bath does not agitate the wafers.

The wafers must be properly aligned prior to bonding, to maximize the possibility of cleaving along the axis. At step 208 the major "flats" of the two silicon wafers are visually aligned by rotating the wafers in their slots in the cassette. With care, this can achieve reasonable crystallographic alignment to ±1°.

At step 210, the wafers are mated to one another. The wafers are thin and light, and hence Van der Waals and other forces will tend to draw the wafers toward one another as soon as they are removed from the cassette. In the prior art, the wafers were simply allowed to press against one another as soon as they were removed. The present invention defines slowly engaging contact between the wafers. Step 210 requires slowly and simultaneously removing the wafers from their adjacent slots in the cassette via the openings 124 and 126. This can be done with gloved fingers or with tweezers, for example.

FIG. 2A shows the wafers being removed from the cassette. The edges 250 of the flats come into contact first. This initiates a contact wave whose propagation front is stopped by the teflon divider between adjacent slots. The wafers are pulled from the cassette very slowly; hence the speed of removal of the wafers is slower than the contact wave propagation speed. Typical contact wave speeds are on the order of 1 cm/sec, with maximum speeds for hydrophilic surfaces being reported to be 2 cm/sec.

In the prior art, the wafers to be bonded are removed, and held in place on parallel chucks which apply a vacuum applied to the backside of each wafer. The wafers are then aligned. The space between the wafers is evacuated to bring the wafers into contact with one another. Vacuum mounting would be unsatisfactory for ultra-thin silicon films because they are easily deformed by the resulting forces, and the deformation would, at least locally, prevent a good bond.

At step 212, the wafer pair is inspected to insure that there are no obvious voids at the interface. Such voids are easily observed as ripples on the thin silicon film, and are not easily removed by, for example, pressure applied to the wafer pair. Upon annealing, the voids tend locally to rupture the thin silicon film, and therefore are to be avoided.

At step 214, the wafer pair is loaded into a 3 inch quartz "boat" for automatic insertion into a 6 foot long, 7 inch diameter, quartz annealing tube. The automatic insertion is important because of the need to carefully control thermal stresses.

At step 216, the boat is gradually inserted into the center of the furnace, pushing at a rate of about 0.5 mm/sec, into an inert gas, preferably $N_2$, environment, flowing at 7.5 l/min, at 300° C.

The inventors have found that this slow push at relatively low temperature is critical to achieve successful bonding. Since the wafers are of different thickness and doping concentration, it is suspected that thermally-induced differential interfacial stress caused by faster pushes at higher temperatures may be minimized or even eliminated when the slow, low temperature push is used. More generally, the push into the furnace, and all other heating and cooling, must be done slowly enough to maintain isothermy of the wafers.

The samples are loaded over roughly 45 minutes. After loading, step 218 begins the curing process by increasing the temperature slowly, at a rate of 50 per minute, to 1100° C., in the same flowing inert gas environment. This anneal strengthens the bond at the interface.

Once reaching 110° C., 2.5 l/min of flowing $O_2$ is added to the annealing environment.

This is followed by annealing for 1 hour at step 220.

The flow of $O_2$ is then turned off, and the furnace temperature lowered to 300° C. at the rate of 5 degrees per minute.

Then the boat is pulled from the furnace at about 0.5 mm/sec in the flowing inert gas at step 222. This slow pull rate continues to minimize the risk of thermal stress-related bond failure.

The boat is allowed to cool, the bonded sample is removed, and inspected.

The inventors have found that this fabrication sequence leads to the production of a bonded pair that can withstand any misorientation-induced stress caused by cleaving along one of the substrate's crystallographic axes. In contrast, without the anneal, attempts to cleave tend to pop the thin silicon film from the substrate. With the anneal, the interface can survive not only cleaving, but also the polishing required to bevel the edge of the sample in order to perform SRP measurements.

Figure 3:
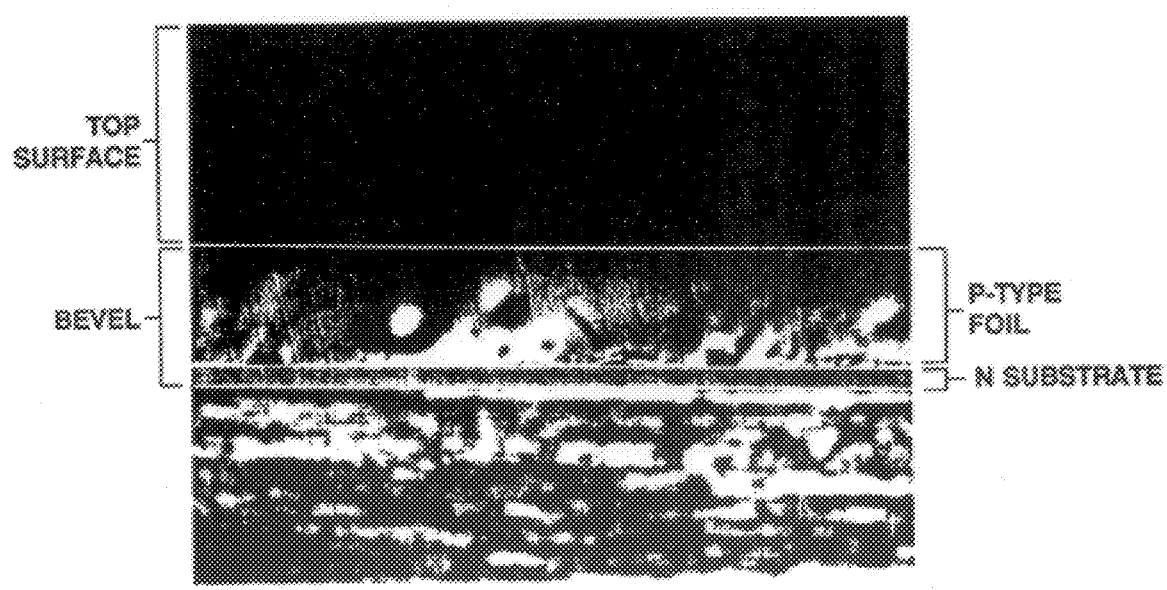
FIG. 3 shows the device formed according to the bonding of the present invention after beveling.

A photograph of a "beveled" interface is shown in FIG. 3. That figure shows the dark patches at the interface are not voids because the foil does not conformally follow the "void". Instead, the dark features indicate that only local chunks of the silicon foil have been ripped away from the interface during polishing, leaving most of the bonded interface intact.

Figure 4:
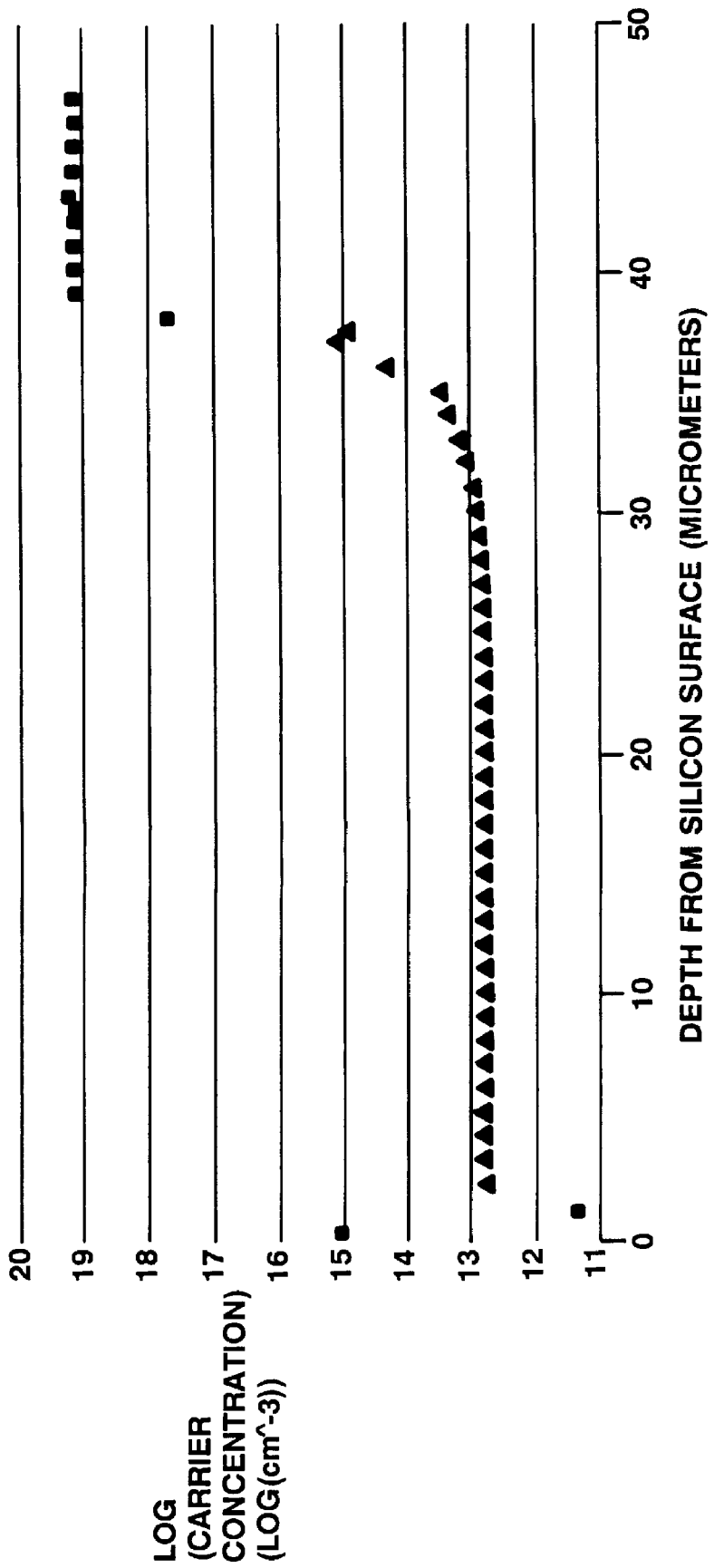
FIG. 4 shows SRP measurements of the final device.

A result of wafer bonding is shown in FIG. 4. FIG. 4 shows the characteristics of a system where a lightly doped, p-type, ultra-thin wafer is bonded to a heavily doped, n-type substrate wafer. The resulting carrier concentration profile is shown in FIG. 4. The carrier concentration is calculated from raw SRP data based on calibration measurements performed on test samples. Two important features to notice are the comparatively abrupt transition from heavy n to light p, and the flatness of the p-profile. Neither of these desireable charateristics are possible with existing technology, but are easily achieved with the bonded structure of the present invention. We have estimated that the thickness of our bonded interface is less than 2 μm.

Three additional features in FIG. 4 should be noted. First, the surface of the p layer has an n layer thereon which is less than 1 μm thick. This layer was formed during the annealing step by out-diffusion of arsenic from the n-type substrate, followed by diffusion into the top p-type film. This unwanted effect can easily be prevented by "capping" the silicon substrate with a diffusion barrier prior to annealing. Second, the interface appears to be less abrupt than it actually is due for two reasons: 1) the presence of an accumulation layer at the interface (the region 26 to 36 μm from the thin film's top surface), 2) a small peak in the SRP data which may be caused either by a chemical oxide at the interface or by the possibility that the SRP measurement was taken over a small void created at the interface during the beveling procedure. We note that the accumulation layer is not the result of arsenic diffusion, which for an 110° C. anneal for approximately 1 hour, has a range of less than 1 μm.

Although only a preferred embodiment has been described in detail above, those having ordinary skill in the art will certainly understand that many modifications are possible without departing from the teachings thereof.

All such modifications are intended to be encompassed within the following claims.

What is claimed is:

1. A method of bonding a thin wafer having a thickness less than 200 μm to another wafer, comprising:
   washing said thin wafer and said another wafer;
   completely drying said wafers;
   aligning said wafers in a definite crystallographic orientation relative to one another;
   loading said wafers into a device with a divider between said thin wafer and said another wafer;
   slowly removing said wafers from said device, so that a first portion of said wafers comes into contact, while said divider separates other portions of said wafers against coming into contact;
   continuing to remove said wafers until said wafers are completely in contact with one another to bond said wafers to one another; and
   increasing a strength of the bond of said contacted wafers.

2. A method as in claim 1, wherein said increasing step comprises annealing said wafers.

3. A method as in claim 2, wherein said annealing comprises:
   loading said bonded wafers into a receptacle;
   inserting said receptacle into a heating oven to gradually heat said bonded wafers at an insertion rate sufficiently slow to maintain substantial isothermy throughout said wafers; and
   curing said wafers in said heated oven.

4. A method as in claim 3, wherein said annealing further comprises cooling said wafers at a rate sufficiently slow to maintain substantial isotherms throughout said wafers.

5. A method as in claim 3, wherein said insertion rate of said receptacle is substantially 0.5 mm/s.

6. A method as in claim 4, wherein said cooling step includes removing said receptacle from said heating oven at a speed of substantially 0.5 mm/s.

7. A method as in claim 1, wherein said removing step comprises removing said wafers at a rate slower than the propagation speed of a contact wave which would result in the absence of a spacer.

8. A method as in claim 1, wherein said completely drying step comprises blow drying said wafers with an inert gas.

9. A method as in claim 1, wherein said washing washes said wafers while said wafers are loaded in said device.

10. A method of bonding a first thin wafer having a thickness which is less than 200 μm, to another second wafer, comprising:
    loading said first and second wafers into a wafer holding device which has a divider between said first and second wafers;
    washing said first and second wafers;
    completely drying said wafers;
    aligning said wafers in a definite crystallographic orientation relative to one another;
    contacting said wafers to one another;
    bonding said wafers by removing said wafers from said device,
    such that during the removing step, at least a first portion of said wafers comes into mutual contact while other portions of said wafers are held apart by said divider, and after the removing step no part of said wafers are held apart by said divider;
    heating said contacted wafers, by gradually increasing a temperature thereof until reaching a bonding temperature to strengthen a bond of said contacted wafers to one another, said heating being sufficiently slow to maintain substantial isothermy in said wafers; and
    gradually decreasing a temperature of said contacted wafers after bonding.

11. A method as in claim 10, further comprising annealing said wafers during said bonding.

12. A method as in claim 11, wherein said heating comprises:
    loading said contacted wafers into a receptacle;
    inserting said receptacle into a heated oven to gradually heat said contacted wafers at substantially 0.5 mm/s; and
    curing said wafers in said heated oven.

13. A method as in claim 10, wherein said contacting comprises:
    slowing removing said wafers from said device, at a rate slower than the propagation speed of a contact wave formed by said mutual contact, so that a first portion of said wafers comes into contact, while said divider separates other portions of said wafers against coming into contact; and
    continuing to remove said wafers until said wafers are completely in contact with one another.

14. A method as in claim 10, wherein said completely drying step comprises blow drying said wafers in inert gas.

15. A method of bonding an ultra-thin silicon wafer to a semiconductor substrate, comprising:
    obtaining an ultra-thin wafer, having a thickness which is less than 200 μm;
    bringing the ultra-thin wafer towards a wafer to which said ultrathin wafer will be bonded, by:
    a) maintaining a separation between said substrates at a time prior to bonding,
    b) aligning said wafers in a definite crystallographic orientation prior to bonding; and
    c) mutually contacting said wafers in said predetermined crystallographic orientation, such that said wafers contact each other in a manner sufficiently slowly so that a first portion of said wafers comes into contact and the speed at which succeeding portions of the wafers come into contact is less than a propagation speed of a contact wave which would result in the absence of a spacer; and
    d) subsequent to said wafers touching, further bonding said wafers to one another using an annealing process.

16. A method as in claim 15 wherein said maintaining comprises using a divider to divide said wafers from one another.

17. A method of bonding an ultra-thin wafer having a thickness less than 200 μm to a semiconductor substrate, comprising:
    obtaining a semiconductor substrate;
    obtaining an ultra-thin wafer of silicon having a thickness less than 200 μm;
    crystallographically aligning said ultra thin wafer and said substrate;
    separating the substrates while the substrates are aligned and maintaining their alignment; and
    allowing the substrates to touch one another, such that said substrates contact each other in a manner sufficiently slowly so that a first portion of said wafers comes into contact, and the speed at which succeeding portions of the wafers come into contact is less than a propagation speed of a contact wave which would result in the absence of a spacer, thereby bonding the substrates to one another.

18. A method of bonding an ultra-thin substrate to another substrate comprising:

obtaining an ultra-thin substrate, having a thickness less than 200 $\mu$m, and formed of silicon;

obtaining another substrate;

engagingly contacting said ultra thin substrate with said another substrate in a manner sufficiently slowly so that a first portion of said substrates comes into contact, and so that the speed at which succeeding portions of the substrates come into contact is less than a propagation speed of a contact wave which would result in the absence of a spacer; and bonding said one substrate to said another substrate.

19. A method of bonding an ultra-thin silicon wafer to a semiconductor substrate, comprising:

obtaining an ultra-thin wafer, having a thickness which is less than 200 82 m;

bringing the ultra-thin wafer towards a wafer to which said ultrathin wafer will be bonded, by:

a) maintaining a separation between said substrates at a time prior to bonding, b) aligning said wafers in a definite crystallographic orientation prior to bonding; and c) mutually contacting said wafers in said predetermined crystallographic orientation, such that said wafers contact each other in a manner sufficiently slowly so that a first portion of said wafers comes into contact and the speed at which succeeding portions of the wafers come into contact is less than a propagation speed of a contact wave which would result in the absence of a spacer; and d) subsequent to said wafers touching, further bonding said wafers to one another using an anodic bonding process.

* * * * *